I

United States Patent
Yang et al.

(10) Patent No.: US 8,779,591 B2
(45) Date of Patent: Jul. 15, 2014

(54) BUMP PAD STRUCTURE

(75) Inventors: Ming-Tzong Yang, Baoshan Township, Hsinchu County (TW); Yu-Hua Huang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 91 days.

(21) Appl. No.: 13/233,808

(22) Filed: Sep. 15, 2011

(65) Prior Publication Data
US 2013/0037937 A1  Feb. 14, 2013

Related U.S. Application Data

(60) Provisional application No. 61/521,511, filed on Aug. 9, 2011.

(51) Int. Cl.
*H01L 23/48*  (2006.01)
(52) U.S. Cl.
USPC ............ 257/757; 257/778; 257/E23.021
(58) Field of Classification Search
USPC ............ 257/737, 778, E23.01, E23.021
See application file for complete search history.

(56) References Cited

U.S. PATENT DOCUMENTS

2010/0117081 A1   5/2010   Obuchi et al.
2011/0241202 A1*  10/2011  Liu et al. .................. 257/737

FOREIGN PATENT DOCUMENTS

JP   2008-294127   12/2008

OTHER PUBLICATIONS

English language translation of abstract of JP 2008-294127 (published Dec. 4, 2008).

* cited by examiner

*Primary Examiner* — Mamadou Diallo
(74) *Attorney, Agent, or Firm* — McClure, Qualey & Rodack, LLP

(57) ABSTRACT

A bump pad structure for a semiconductor package is disclosed. A bump pad structure includes a conductive pad disposed on an insulating layer. A ring-shaped conductive layer is embedded in the insulating layer and is substantially under and along an edge of the conductive pad. At least one conductive via plug is embedded in the insulating layer and between the conductive pad and the ring-shaped conductive layer, such that the conductive pad is electrically connected to the ring-shaped conductive layer.

19 Claims, 4 Drawing Sheets

BUMP PAD STRUCTURE

CROSS REFERENCE TO RELATED APPLICATIONS

This application claims the benefit of U.S. Provisional Application No. 61/521,511, filed Aug. 9, 2011, the entirety of which is incorporated by reference herein.

BACKGROUND OF THE INVENTION

1. Field of the Invention

The invention relates to semiconductor package technology and more particularly to a bump pad structure for interconnection of electronic devices.

2. Description of the Related Art

In the microelectronics industry, the manufacturing of integrated circuits (ICs) typically comprises the fabrication and packaging of ICs. The IC dies or chips are packaged and electrically connected to external circuits, such as packaging substrate boards, printed circuit boards (PCBs) or other dies/chips by bump/bond pads thereon. In order to electrically connect the dies/chips to external circuits, wires and/or conductive bumps are typically applied. For example, conductive bumps are formed on the corresponding bump/bond pads of a die and then the die is flipped, thereby connecting the conductive bumps to corresponding contacts formed on an external circuit.

Recently, due to the continually increasing manufacturing costs and environmental factors, lead-free solders for conductive bumps are being used more and more. Such lead-free solders, however, may cause "white bumps" due to the migration to lead-free solders. "White bumps" is a term that refers to the issue of die/chip cracking due to translation of vertical stress when a die/chip is joined or due to other thermal processing procedures, after the die/chip is joined to the organic laminate, in a package. The white bump problem is particularly serious with lead-free C4 (Controlled Collapse Chip Connection) technology, due to the stiffness of the lead-free bump.

FIG. 1 is a cross section of a conventional bump pad structure 100 for a chip. The bump pad structure 100 includes an insulating layer 101, such as a low dielectric constant (k) material layer, having a multi-layered interconnect structure comprising metal layers 102, 104, 106, and 108 therein, which are separated from each other. Moreover, metal via plugs are disposed between the metal layers 102, 104, 106, and 108 and are electrically connected to the metal layers 102, 104, 106, and 108. The multi-layered interconnect structure is typically connected to electronic devices in a die/chip (not shown). A bump pad 112 is formed directly on the uppermost metal layer 108 of the multi-layered interconnect structure and is partially covered by a passivation layer 110. An under bump metallurgic (UBM) layer 114 is formed on the bump pad 112 exposed from the passivation layer 110 for the placement of a lead-free solder bump (not shown).

In such a bump pad structure 100, the bump pad 112 typically uses a large via 112a to contact the multi-layered interconnect structure and may cause huge vertical stress. In order to prevent the insulating layer 101 from damage due to the applied stress, at least two thick metal layers 106 and 108 are used. If only one thick metal layer is used, the huge stress applied may induce "white bumps" as mentioned above, reducing reliability of the device. However, the use of two thick metal layers may increase the manufacturing cost.

Accordingly, there is a need to develop a novel bump pad structure which is capable of mitigating the aforementioned problems.

BRIEF SUMMARY OF THE INVENTION

An exemplary embodiment of a bump pad structure comprises an insulating layer. A conductive pad is disposed on the insulating layer. A ring-shaped conductive layer is embedded in the insulating layer and is substantially under and along an edge of the conductive pad. At least one conductive via plug is embedded in the insulating layer and between the conductive pad and the ring-shaped conductive layer, such that the conductive pad is electrically connected to the ring-shaped conductive layer.

Another exemplary embodiment of a bump pad structure comprises an insulating layer. A conductive pad is disposed on the insulating layer. At least one conductive segment is embedded in the insulating layer and substantially under an edge of the conductive pad. At least one first conductive via plug is embedded in the insulating layer and between the conductive pad and the conductive segment, such that the conductive pad is electrically connected to the conductive segment.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
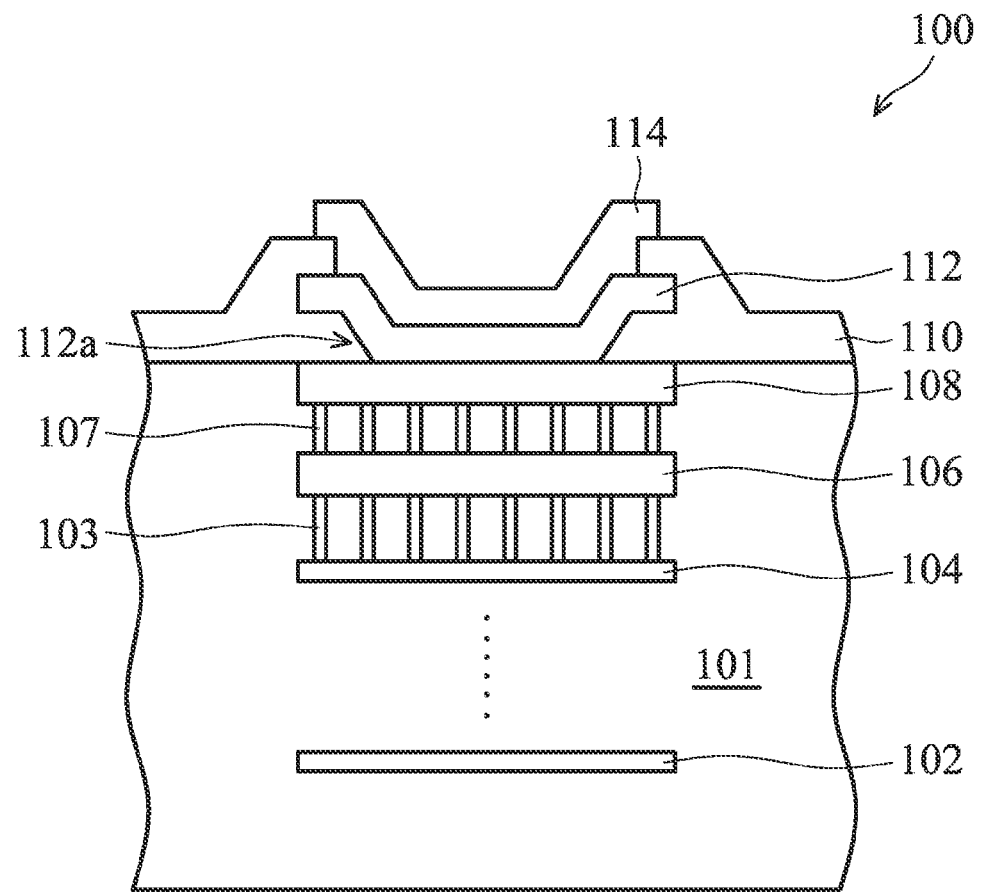
FIG. 1 is a cross section of a conventional bump pad structure for a chip.

The following description encompasses the fabrication process and the purpose of the invention. It can be understood that this description is provided for the purpose of illustrating the fabrication process and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

Figure 2A:
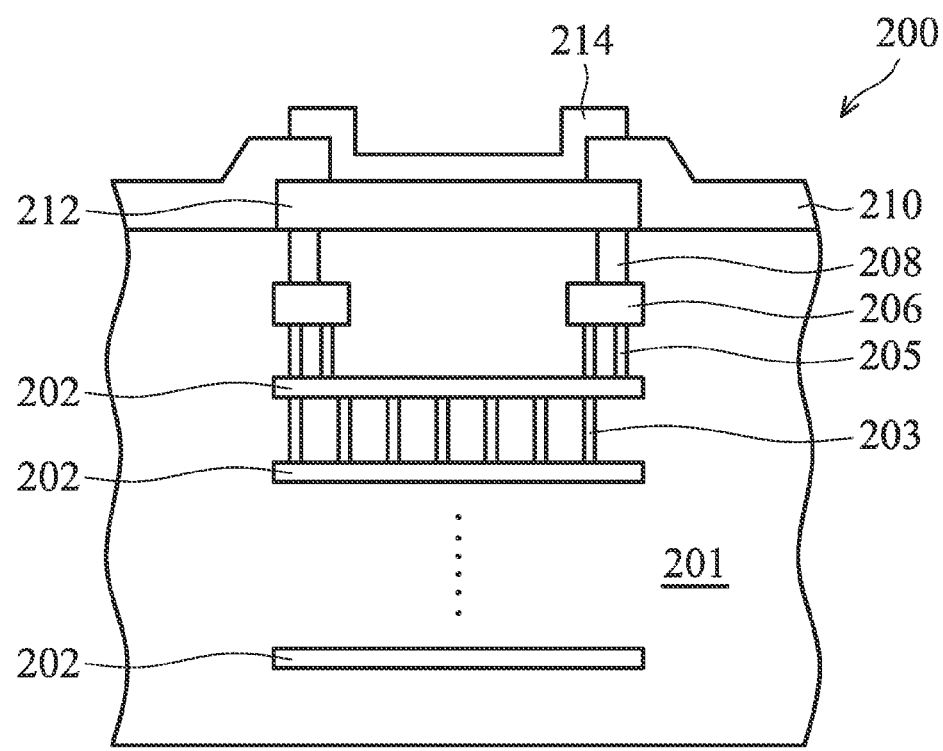
FIG. 2A is a cross section of an exemplary embodiment of a bump pad structure with a ring-shaped conductive layer according to the invention.
Figure 2B:
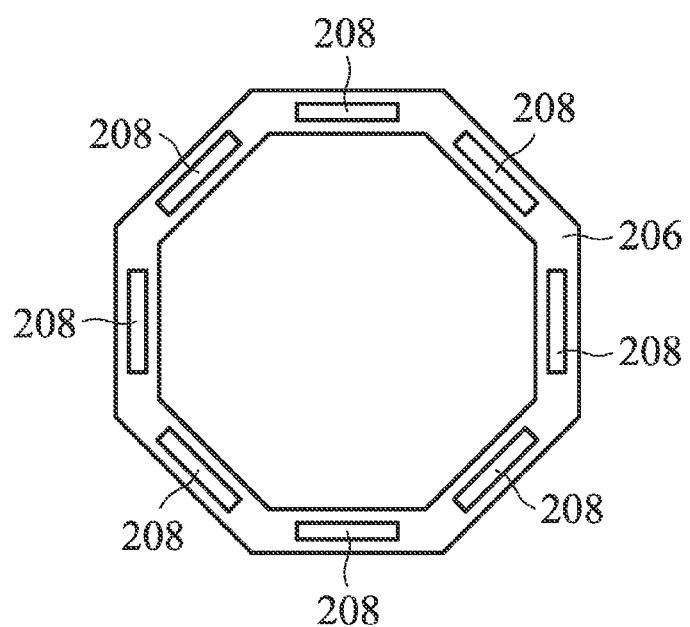
FIG. 2B is a plan view of the ring-shaped conductive layer shown in FIG. 2A.

Referring to FIGS. 2A and 2B, which respectively illustrate a cross section of an exemplary embodiment of a bump pad structure with a ring-shaped conductive layer according to the invention and a plan view of the ring-shaped conductive layer shown in FIG. 2A, the bump pad structure 200 may be used in a die/chip, package substrate or the like. As shown in FIG. 2A, the bump pad structure 200 comprises an insulating layer 201. In one embodiment, the insulating layer 201 is formed on a semiconductor substrate (not shown). The semiconductor substrate may comprise a silicon substrate or other semiconductor substrates. The semiconductor substrate may contain a variety of elements, including transistors, resistors, and other semiconductor elements which are well known in the art. The insulating layer 201 may serve as an interlayer dielectric (ILD) or inter-metal dielectric (IMD) layer and comprise oxide, nitride, oxynitride, or combinations thereof, or low k material, such as fluorinated silicate glass (FSG), carbon doped oxide, methyl silsesquioxane (MSQ), hydrogen silsesquioxane (HSQ), or fluorine tetra-ethyl-orthosilicate (FTEOS). The insulating layer 201 may be formed by, for example, chemical vapor deposition (CVD), low pressure chemical vapor deposition (LPCVD), plasma enhanced chemical vapor deposition (PECVD), high density plasma chemical vapor deposition (HDPCVD) or other deposition processes well known in the art.

A multi-layered interconnect structure is embedded in the insulating layer 101 and electrically connected to the elements (not shown) formed in or on the semiconductor substrate (not shown). The multi-layered interconnect structure can be formed by a conventional damascene process and may comprise a plurality of conductive layers 202 in different levels of the insulating layer 101, such that the conductive layers 202 therein are separated from each other. Moreover, the multi-layered interconnect structure also comprises a plurality of conductive via plugs 203 disposed between the plurality of conductive layers 202 in different levels of the insulating layer 101 and electrically connected to the plurality of conductive layers 202.

A conductive pad 212 serving as a bump/bond pad is disposed on the insulating layer 101. The conductive pad 212 may comprise aluminum, copper, alloy thereof, or other suitable metal well known in the art.

A passivation layer 210 is formed on the insulating layer 201 and covers the conductive pad 212. The passivation layer 210 may comprise an organic material (e.g., solder mask) or an inorganic material (e.g., silicon oxide or silicon nitride) and be formed by a deposition process. An opening is formed in the passivation layer 210 to expose the upper surface of the conductive pad 212, serving as a contact window for a subsequent bumping process.

A UBM layer 214 is formed on the conductive pad 212 exposed from the passivation layer 210 for the placement of a lead-free solder bump (not shown). Typically, the UBM layer 214 has a multi-layer structure and may include an adhesion layer (e.g., TiW) followed by a diffusion barrier layer (e.g., Ni, NiV, or CrCu) and then a solder wettable layer (e.g., Cu).

In particular, in the embodiment, a ring-shaped conductive layer 206, which has a thickness greater than that of each conductive layer 202 of the multi-layered interconnect structure, is embedded in the insulating layer 201 and located at a level higher than that of the multi-layered interconnect structure for reducing the huge vertical stress applied from the conductive pad 212 to the multi-layered interconnect structure.

The ring-shaped conductive layer 206 may comprise copper and be formed by a conventional damascene process. Moreover, the ring-shaped conductive layer 206 is substantially disposed under and along an edge of the conductive pad 212 and is electrically connected to the multi-layered interconnect structure through the conductive via plugs 205 that is embedded in the insulating layer 201 between the ring-shaped conductive layer 206 and the multi-layered interconnect structure, such that the vertical stress applied from the conductive pad 212 can be shared by the ring-shaped conductive layer 206 and the portion of the insulating layer 201 between the conductive pad 212 and the multi-layered interconnect structure. Namely, the portion of the insulating layer 201 between the conductive pad 212 and the multi-layered interconnect structure may serve as a stress buffer layer to reduce the stress applied to the multi-layered interconnect structure.

In one embodiment, the ring-shaped conductive layer 206 is octagonal as viewed from a top-view perspective, as shown in FIG. 2B. In another embodiment, the ring-shaped conductive layer 206 may be circular, rectangular, hexagonal, or polygonal as viewed from a top-view perspective.

At least one conductive via plug 208 is embedded in the insulating layer 201 and between the conductive pad 212 and the ring-shaped conductive layer 206, such that the conductive pad 212 is electrically connected to the ring-shaped conductive layer 206. In the embodiment, a plurality of conductive via plugs 208 is embedded in the insulating layer 201 and correspondingly arranged along the edge of the octagonal ring-shaped conductive layer 206. Moreover, each conductive via plug 208 may be rectangular or square as viewed from a top-view perspective.

Since the stress is applied from the conductive pad 212 through each conductive via plug 208 and the ring-shaped conductive layer 206 to the multi-layered interconnect structure, the area of the conductive via plug 208 which is smaller than that of the via 112a shown in FIG. 1 may be applied with a relatively smaller stress to the multi-layered interconnect structure. Moreover, since the stress applied from the conductive pad 212 is concentrated near the center of the conductive pad 212, the ring-shaped conductive layer 206 placed under the edge of the conductive pad 212 may also apply a small stress to the multi-layered interconnect structure. Accordingly, damage of the insulating layer 101 due to translation of the stress on the multi-layered interconnect structure can be mitigated or eliminated. Additionally, compared to the use of two thick metal layers in the conventional art for preventing the white bump problem, the use of the bump pad structure with a ring-shaped conductive layer according to the foregoing embodiment can further reduce manufacturing cost and increase product competitiveness.

Figure 3A:
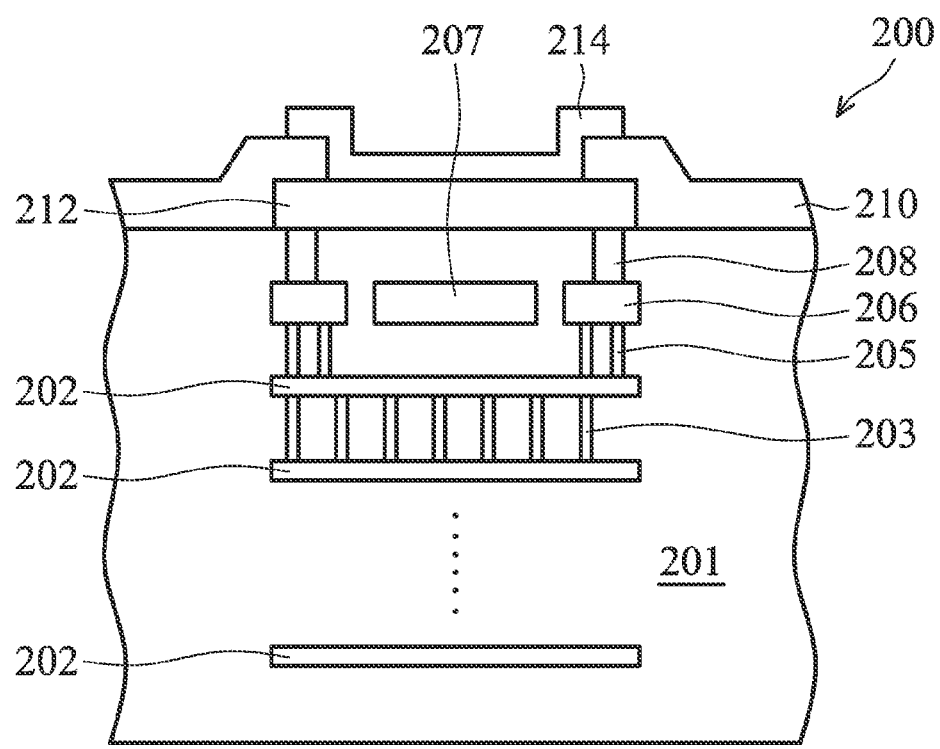
FIG. 3A is a cross section of another exemplary embodiment of a bump pad structure with a ring-shaped conductive layer according to the invention.
Figure 3B:
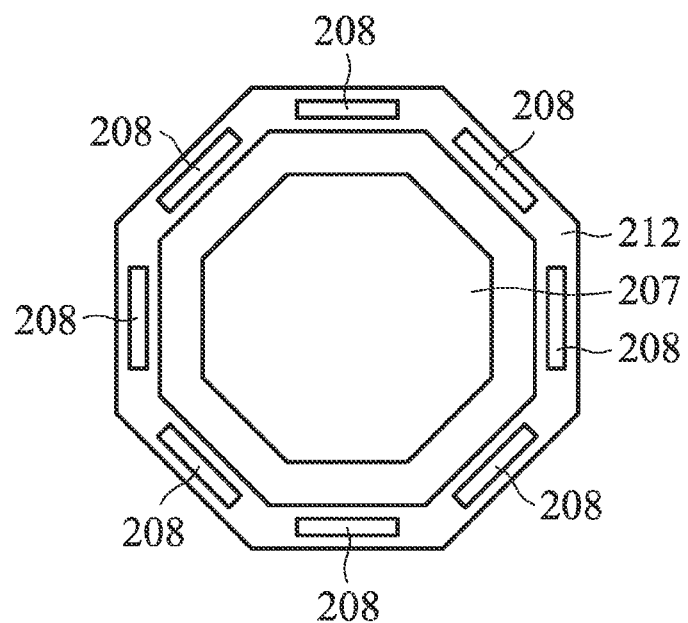
FIG. 3B is a plan view of the ring-shaped conductive layer shown in FIG. 3A.

Referring to FIGS. 3A and 3B, which respectively illustrate a cross section of an exemplary embodiment of a bump pad structure with a ring-shaped conductive layer according to the invention and a plan view of the ring-shaped conductive layer shown in FIG. 3A. Elements in FIGS. 3A and 3B that are the same as those in FIGS. 2A and 2B are labeled with the same reference numbers as in FIGS. 2A and 2B and are not described again for brevity. In the embodiment, the bump pad structure 100 is the same as that of the embodiment shown in FIGS. 2A and 2B except that a floating conductive layer 207 is embedded in the insulating layer 201 directly under the conductive pad 212 and is surrounded by the ring-shaped conductive layer 206.

The term "floating" means the conductive layer 207 is electrically insulated from the conductive pad 212 and any elements formed in or on the semiconductor substrate as mentioned above. In the embodiment, the floating conductive layer 207 is located at the same level as that of the ring-shaped conductive layer 206. In one embodiment, the floating conductive layer 207 and the ring-shaped conductive layer 206 can be formed simultaneously by a conventional damascene process, and thus the floating conductive layer 207 may comprise the same material as that of the ring-shaped conductive layer 206. Alternatively, the floating conductive layer 207 is formed before or after the formation of the ring-shaped conductive layer 206 and may comprise a material which is the same or different from that of the ring-shaped conductive layer 206.

The additional floating conductive layer 207 may further enhance the supportability for the conductive pad 212 in the bump pad structure 100. Moreover, since the conductive layer 207 is floated, no parasitic capacitance is induced by the conductive layer 207. Additionally, the advantages obtained by the bump pad structure 100 shown in FIG. 2A can be obtained by the bump pad structure 100 of this embodiment.

Figure 4A:
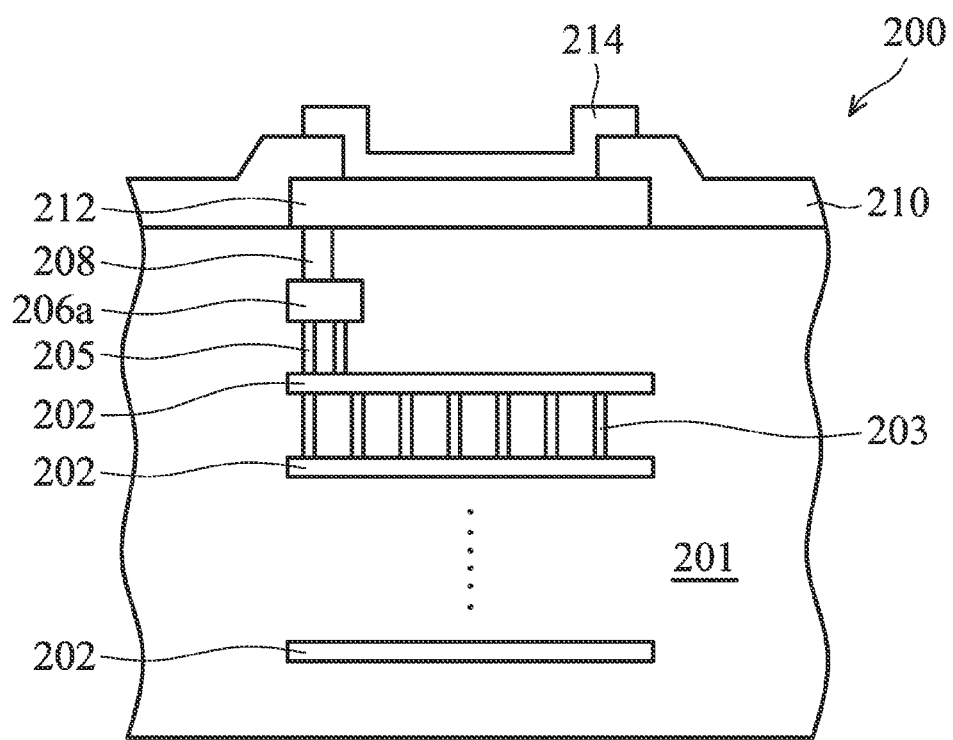
FIG. 4A is a cross section of another exemplary embodiment of a bump pad structure with a conductive segment according to the invention.
Figure 4B:
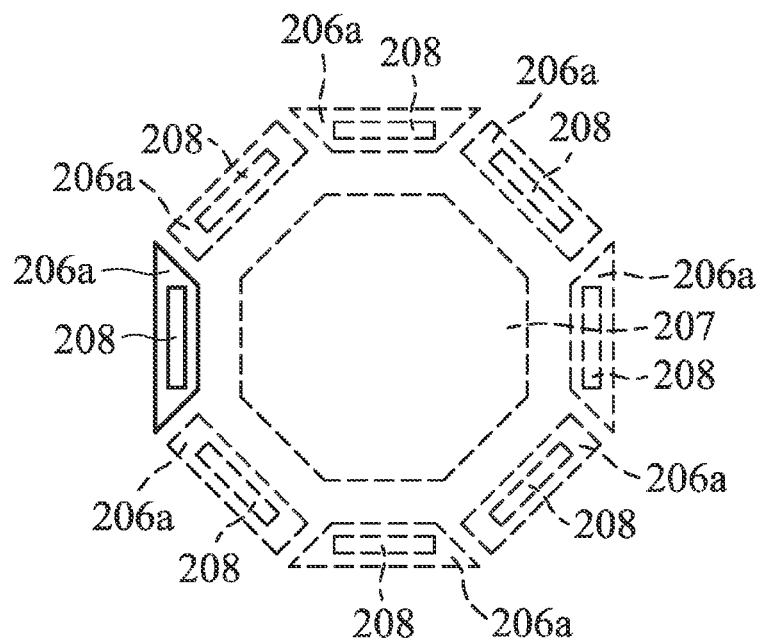
FIG. 4B is a plan view of the conductive segment shown in FIG. 4A.

Referring to FIGS. 4A and 4B, which respectively illustrate a cross section of an exemplary embodiment of a bump pad structure with a conductive segment according to the invention and a plan view of the conductive segment shown in FIG. 4A. Elements in FIGS. 4A and 4B that are the same as those in FIGS. 2A and 2B are labeled with the same reference numbers as in FIGS. 2A and 2B and are not described again for brevity. In the embodiment, the bump pad structure 100 is similar to that shown in FIG. 2A, and the difference is that at least one conductive segment 206a, which is substantially under an edge of the conductive pad 212, is used instead of the ring-shaped conductive layer 206 shown in FIG. 2A, such that at least one conductive via plug 205 is embedded in the insulating layer 201 and between the conductive pad 212 and the conductive segment 206a for electrical connection between the conductive pad 212 and the conductive segment 206a.

In the embodiment, since the conductive segment 206a occupy a smaller area than that of the ring-shaped conductive layer 206 shown in FIG. 2A, the saved area can be provided for wireline routing, thereby increasing the design flexibility of the wireline routing. Also, the advantages obtained by the bump pad structure 100 shown in FIG. 2A can be obtained by the bump pad structure 100 of this embodiment.

In another embodiment, the bump pad structure 100 may comprise a plurality of conductive segments 206a and a plurality of conductive via plug 208 corresponding thereto. For example, the plurality of conductive segments 206a is arranged in a ring and is substantially under and along an edge of the conductive pad 212, as shown in FIG. 4B. Also, the advantages obtained by the bump pad structure 100 shown in FIG. 2A can be obtained by the bump pad structure 100 of this embodiment. Note that although the discontinuous ring of the embodiment is octagonal as viewed from a top-view perspective circular, the discontinuous ring may also be rectangular, hexagonal, or polygonal as viewed from a top-view perspective in some embodiments.

In yet another embodiment, the bump pad structure 100 may further comprise a floating conductive layer 207 embedded in the insulating layer 201 directly under the conductive pad 212 and surrounded by the plurality of conductive segments 206a, as shown in FIG. 4B. Accordingly, the advantages obtained by the bump pad structure 100 shown in FIG. 3A can be obtained by the bump pad structure 100 of this embodiment.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bump pad structure, comprising:
    an insulating layer;
    a conductive pad disposed on the insulating layer;
    a ring-shaped conductive layer embedded in the insulating layer and substantially under and along an edge of the conductive pad; and
    at least one first conductive via plug embedded in the insulating layer and between the conductive pad and the ring-shaped conductive layer, such that the conductive pad is electrically connected to the ring-shaped conductive layer.

2. The bump pad structure of claim 1, further comprising a floating conductive layer embedded in the insulating layer directly under the conductive pad and surrounded by the ring-shaped conductive layer.

3. The bump pad structure of claim 1, further comprising a multi-layered interconnect structure embedded in the insulating layer under the ring-shaped conductive layer and electrically connected to the ring-shaped conductive layer, comprising:
    a plurality of conductive layers separated from each other; and
    a plurality of second conductive via plugs disposed between the plurality of conductive layers and electrically connected to the plurality of conductive layers.

4. The bump pad structure of claim 1, further comprising an under bump metallurgic layer disposed on the conductive pad.

5. The bump pad structure of claim 1, wherein the conductive pad comprises aluminum.

6. The bump pad structure of claim 1, wherein the ring-shaped conductive layer comprises copper.

7. The bump pad structure of claim 1, wherein the ring-shaped conductive layer is circular, rectangular, hexagonal, octagonal, or polygonal as viewed from a top-view perspective.

8. The bump pad structure of claim 1, wherein the first conductive via plug comprises the same material as that of the conductive pad.

9. The bump pad structure of claim 1, wherein the first conductive via plug is rectangular or square as viewed from a top-view perspective.

10. A bump pad structure, comprising:
    an insulating layer;
    a conductive pad disposed on the insulating layer;
    at least one conductive segment embedded in the insulating layer and substantially under a side edge of the conductive pad; and
    at least one first conductive via plug embedded in the insulating layer and between the conductive pad and the conductive segment, such that the conductive pad is electrically connected to the conductive segment.

11. The bump pad structure of claim 10, wherein the bump pad structure comprises a plurality of conductive segments and a plurality of first conductive via plugs corresponding thereto, wherein the plurality of conductive segments is arranged in a ring and is substantially under and along an edge of the conductive pad.

12. The bump pad structure of claim 11, further comprising a floating conductive layer embedded in the insulating layer directly under the conductive pad and surrounded by the plurality of conductive segments.

13. The bump pad structure of claim 11, wherein the ring is circular, rectangular, hexagonal, octagonal, or polygonal as viewed from a top-view perspective.

14. The bump pad structure of claim 10, further comprising a multi-layered interconnect structure embedded in the insulating layer under the at least one conductive segment and electrically connected to the at least one conductive segment, comprising:

a plurality of conductive layers separated from each other; and a plurality of second conductive via plugs disposed between the plurality of conductive layers and electrically connected to the plurality of conductive layers.

15. The bump pad structure of claim 10, further comprising an under bump metallurgic layer disposed on the conductive pad.

16. The bump pad structure of claim 10, wherein the conductive pad comprises aluminum.

17. The bump pad structure of claim 10, wherein the conductive segment comprises copper.

18. The bump pad structure of claim 10, wherein the first conductive via plug comprises the same material as that of the conductive pad.

19. The bump pad structure of claim 10, wherein the first conductive via plug is rectangular or square as viewed from a top-view perspective.

* * * * *